(12) United States Patent
Kim et al.

(10) Patent No.: US 9,406,583 B2
(45) Date of Patent: Aug. 2, 2016

(54) COF TYPE SEMICONDUCTOR PACKAGE AND METHOD OF MANUFACTURING THE SAME

(71) Applicant: Dongbu Hitek Co., Ltd., Seoul (KR)

(72) Inventors: Sung Jin Kim, Gyeonggi-do (KR); Jun Il Kim, Gyeonggi-do (KR); Hag Mo Kim, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 14/370,391

(22) PCT Filed: Feb. 14, 2014

(86) PCT No.: PCT/KR2014/001239
§ 371 (c)(1),
(2) Date: May 12, 2015

(87) PCT Pub. No.: WO2015/076457
PCT Pub. Date: May 28, 2015

(65) Prior Publication Data
US 2015/0262906 A1  Sep. 17, 2015

(30) Foreign Application Priority Data

Nov. 21, 2013 (KR) .................. 10-2013-0142046
Nov. 29, 2013 (KR) .................. 10-2013-0147066

(51) Int. Cl.
*H01L 23/00* (2006.01)
*H01L 23/373* (2006.01)
*H01L 23/538* (2006.01)
(Continued)

(52) U.S. Cl.
CPC .......... *H01L 23/3736* (2013.01); *H01L 21/563* (2013.01); *H01L 23/293* (2013.01);
(Continued)

(58) Field of Classification Search
CPC . H01L 23/28; H01L 23/3107; H01L 23/3157; H01L 23/3736; H01L 23/5387; H01L 24/05; H01L 24/50; H01L 23/3142; H01L 23/4334; H01L 2924/00; H01L 2224/73203; H01L 24/81; H01L 21/563; H01L 23/4985; H01L 21/4839; H01L 2225/107; H01L 2224/50
USPC .......... 257/688, E23.034, E23.055, 778, 787, 257/E23.039, E21.511
See application file for complete search history.

(56) References Cited

U.S. PATENT DOCUMENTS

2005/0206016 A1* 9/2005 Shohji .................. H01L 21/563
257/787
2008/0258290 A1* 10/2008 Nakajima ............... H01L 24/27
257/690

FOREIGN PATENT DOCUMENTS

KR    10 2010 0135161 A    12/2010

OTHER PUBLICATIONS

Korean Office Action for Application No. 10-2013-0142046 dated Jan. 19, 2015.

*Primary Examiner* — Jasmine Clark
(74) *Attorney, Agent, or Firm* — Patterson Thuente Pedersen, P.A.

(57) ABSTRACT

Provided is a chip on film (COF) type semiconductor package. The COF type semiconductor device includes a flexible film, an electrode pattern formed on the flexible film, a semiconductor device disposed on the electrode pattern, a conductive pad disposed between the electrode pattern and the semiconductor device to electrically connect the semiconductor device with the electrode pattern, and a first protective layer which seals the conductive pad and the semiconductor device and is formed on a portion of the electrode pattern and the semiconductor device. The first protective layer includes a heat conductive material for dissipating heat generated from the semiconductor device.

9 Claims, 6 Drawing Sheets

(51) Int. Cl.
 H01L 23/535 (2006.01)
 H01L 23/29 (2006.01)
 H01L 23/31 (2006.01)
 H01L 21/56 (2006.01)
 H01L 23/367 (2006.01)
 H01L 23/498 (2006.01)
(52) U.S. Cl.
 CPC .......... H01L23/295 (2013.01); H01L 23/3121 (2013.01); H01L 23/3157 (2013.01); H01L 23/367 (2013.01); H01L 23/3735 (2013.01); H01L 23/4985 (2013.01); H01L 23/535 (2013.01); H01L 23/5387 (2013.01); H01L 24/03 (2013.01); H01L 24/05 (2013.01); H01L 24/50 (2013.01); *H01L 2224/0401* (2013.01); *H01L 2224/13144* (2013.01); *H01L 2924/12041* (2013.01); *H01L 2924/12044* (2013.01); *H01L 2924/14* (2013.01)

COF TYPE SEMICONDUCTOR PACKAGE AND METHOD OF MANUFACTURING THE SAME

TECHNICAL FIELD

The present invention relates to a chip on film (COF) type semiconductor package, and more particularly, to a structure which may effectively dissipate heat generated from a semiconductor package while effectively protecting a COF type semiconductor package prepared on a flexible printed circuit board (PCB) from external impacts.

BACKGROUND ART

A typical liquid crystal display is a device displaying an image by adjusting optical transmittance of liquid crystals using an electric field. For displaying an image, a liquid crystal display includes a liquid crystal panel, in which liquid crystal cells are arranged in the form of a matrix, and a driving circuit for driving the liquid crystal panel. Since liquid crystal displays may be miniaturized in comparison to cathode ray tube displays, the liquid crystal displays are being widely used as display devices such as portable televisions or laptop personal computers.

A data driver and a gate driver are required for driving a liquid crystal panel of a liquid crystal display, and the data driver and the gate driver are integrated into a plurality of integrated circuits (ICs). The integrated data driver IC and gate driver IC may be respectively mounted on a tape carrier package (TCP), and may be connected to the liquid crystal panel by using a tape automated bonding (TAB) method or may be mounted on the liquid crystal panel by using a chip on glass (COG) method.

In particular, in the current situation in which display devices realizing high resolution are appeared and highly integrated ICs are required for cost reduction, an issue related to heat dissipation of integrated circuits that are necessary for display devices has emerged more seriously. The heat issue may not only affect the stability of the circuits but may also pose a threat to a heat-resistant temperature of a flexible base film. Further, in the latest ultra-high resolution display devices such as full high definition (FHD) or ultra high definition (UHD) TVs, heat resistance of a frame constituting an exterior of the TV must be in consideration due to the heat generation of integrated circuits.

If the heat generated from an integrated circuit can be sufficiently dissipated, limitations in design or materials of various display devices having integrated circuits used therein may be more easily addressed.

DISCLOSURE OF THE INVENTION

Technical Problem

The present invention provides a heat dissipation structure of a chip on film (COF) semiconductor device package, in which a semiconductor device, particularly as a semiconductor device used in a liquid crystal panel or printed circuit board, is mounted on a flexible film.

The present invention also provides a structure in which the position of a semiconductor device may not only be fixed but the semiconductor device may also be easily protected from the outside by forming a heat dissipation paint on the semiconductor device that is formed on a flexible film.

Technical Solution

According to an aspect of the present invention, there is provided a chip on film (COF) type semiconductor package. The COF type semiconductor package may include a flexible film, an electrode pattern formed on the flexible film, a semiconductor device disposed on the electrode pattern, a conductive pad disposed between the electrode pattern and the semiconductor device to electrically connect the semiconductor device with the electrode pattern, and a first protective layer which seals the conductive pad and the semiconductor device and is formed on a portion of the electrode pattern and the semiconductor device. The first protective layer may include a heat conductive material for dissipating heat generated from the semiconductor device.

According to another aspect of the present invention, there is provided a method of manufacturing a COF type semiconductor package. The method may include initiating transfer of the semiconductor device by an operation of a reel, in a state in which the semiconductor device is mounted on a base film that is formed of a flexible material and the base film is wound on the reel, transferring the semiconductor device to a potting chamber in which a potting device filled with a heat dissipation paint is prepared, coating sides of the semiconductor device with the heat dissipation paint by using the potting device to form an underfill, transferring the semiconductor device to a coating chamber in which a spray nozzle is prepared, coating the semiconductor device and the underfill with the heat dissipation paint by using the spray nozzle to form an upperfill, transferring the semiconductor device to a curing chamber, curing the underfill and the upperfill for a predetermined time in the curing chamber, transferring the semiconductor device to a recovery chamber in which a recovery reel is prepared, and winding the base film, on which the underfill and the upperfill is formed, by using the recovery reel.

Advantageous Effects

A chip on film (COF) type semiconductor package according to the present invention may effectively dissipate high heat generated from a semiconductor device to the outside and may change a material of a bezel or chassis forming an exterior except a liquid crystal panel in an ultra-high resolution TV or monitor. For example, with respect to an ultra-high resolution TV, bezel and chassis parts may be reduced to achieve a slimmer design, wherein a material, such as aluminum, has been used for withstanding high heat generated from ICs. However, when the heat generation of the ICs may be effectively reduced according to the present embodiment, the bezel and chassis pats of the TV may be formed of a plastic material, and thus, weight reduction of the product and the reduction of production costs may be achieved.

MODE FOR CARRYING OUT THE INVENTION

Figure 1:
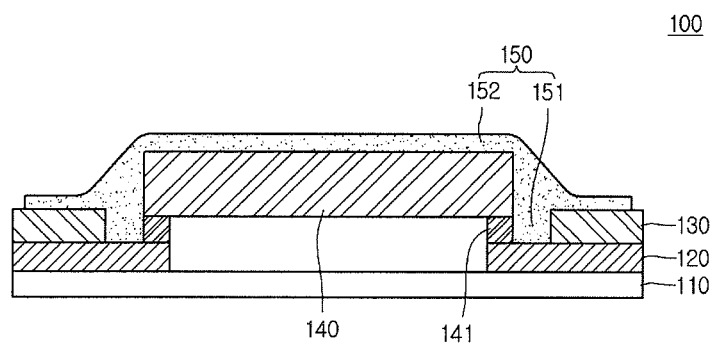
FIG. 1 illustrates a configuration of a chip on film (COF) type semiconductor package according to the present embodiment.

FIG. 1 illustrates a configuration of a chip on film (COF) type semiconductor package according to the present embodiment.

First, the present invention may be implemented on a driver IC mounted on a tape carrier package (TCP) or COF that is installed an edge of a display device panel body, such as liquid crystal display (LCD), plasma display panel (PDP), organic light-emitting diode (OLED), light-emitting diode (LED), and radio frequency identification (RFID), in which semiconductor devices are used.

Referring to FIG. 1, a semiconductor package 100 according to an embodiment of the present invention includes a base film 110 of a flexible material, an electrode pattern 120 formed on the base film 110, a conductive pad 141 electrically connected to the electrode pattern 120, a semiconductor device 140 disposed on the conductive pad 141, a second protective layer 130 formed at a predetermined spacing from the conductive pad 141 while being formed on the electrode pattern 120, and a first protective layer 150 formed on the semiconductor device 140 and the second protective layer 130.

Herein, the conductive pad 141 may be mounted on the semiconductor device 140 and may be formed as a solder bump or a gold bump. As another embodiment, the conductive pad 141 may be formed in one piece with the semiconductor device 140, and in this case, the electrode pattern 120 is formed, and the conductive pad 141 and the semiconductor device 140 are then positioned together by a process of fixing the conductive pad 141 formed under the semiconductor device 140 to a top surface of the electrode pattern 120.

In particular, the first protective layer 150 is formed on the second protective layer 130 and the semiconductor device 140 by using a heat dissipation paint so as to seal the semiconductor device 140.

Specifically, the first protective layer 150 is formed on the second protective layer 130 and an entire surface of the semiconductor device 140 exposed to the outside on the base film 110 by a thin film forming method such as coating or deposition. The first protective layer 150 may not only protect elements included in the semiconductor package from external impacts, but may also effectively dissipate the generated heat.

The first protective layer 150 may be divided into an underfill 151 and an upperfill 152 according to the formation position thereof. The underfill 151 is formed in a space between the semiconductor device 140 and the second protective layer 130, and the upperfill 152 is formed on the semiconductor device 140, the underfill 151, and the second protective layer 130 in the form of extending from the underfill 151. Herein, the upperfill 152 may seal entire surfaces of the semiconductor device 140 exposed on the based film 110 and the underfill 151, and may seal at least a portion of the second protective layer 130.

The heat dissipation paint, as a constituent of the first protective layer 150, includes a material for improving adhesion with other adjacent elements in addition to a material for heat dissipation. Thus, the underfill 151 and the upperfill 152 constituting the first protective layer 150 may not only effectively dissipate heat generated from the semiconductor device 140, but may also firmly fix the position of other elements in contact therewith.

With respect to the underfill 151, it may fix the position of the conductive pad 141 and the second protective layer 130 while being disposed on the electrode pattern 120. In particular, the conductive pad 141 supporting the semiconductor device 140 may prevent a phenomenon in which an electrode is open or short circuit due to external heat, humidity, or impacts.

With respect to the upperfill 152, it may not only be coated on the semiconductor device 140, the underfill 151, and the second protective layer 130 to fix the position of these elements, but may also protect the semiconductor device 140 from external impacts. Eventually, the first protective layer 150 may more firmly protect elements in contact therewith by being formed on sides of the semiconductor device 140 and sides of the conductive pad 141 as well as a top surface of the semiconductor device 140.

In the present embodiment, in order to form the first protective layer 150, a thin film forming process, such as coating or deposition for forming the underfill 151, and a thin film forming process such as coating or deposition for forming the upperfill 152 may be respectively performed. The underfill 151 and the upperfill 152 may not be respectively formed as described above, but may be formed together by using the same thin film forming process. In this case, when the underfill 151 and the upperfill 152 are respectively formed, the underfill 151 may be more closely attached to the conductive pads 141.

In the drawing, it is illustrated that the second protective layer 130 is formed on the electrode pattern 120 and the underfill 151 is formed in a space between the conductive pad 141 and the second protective layer 130 on the electrode pattern 120. However, depending on embodiments, the second protective layer 130 may not be formed. In this case, the underfill 151 is formed on the electrode pattern 120 and the sides of the conductive pad 141. In a case where the second protective layer 130 is not formed as described above, the underfill 151 and the upperfill 152 may not be separately formed, but may be formed in one piece at the same time. These embodiments will be described later with reference to the accompanying drawings.

The heat dissipation paint constituting the first protective layer 150, i.e., the underfill 151 and the upperfill 152, will be described in detail.

Figure 6:
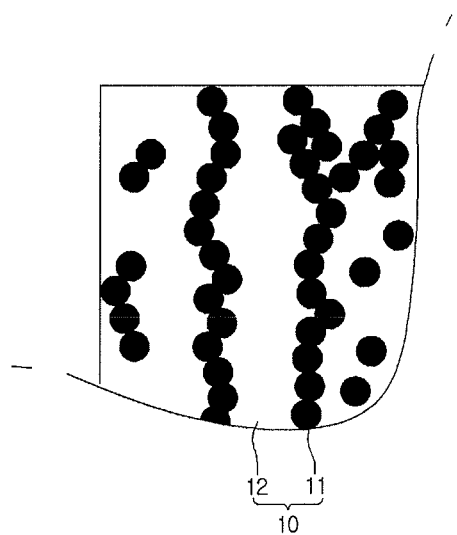
FIG. 6 is an enlarged view of a heat dissipation paint according to an embodiment of the present invention.

FIG. 6 is an enlarged view of a heat dissipation paint according to an embodiment of the present invention.

Referring to FIG. 6, a heat dissipation paint 10 according to the embodiment of the present invention includes a heat dissipation material 11 formed of fine particles and an adhesive material 12 improving the adhesiveness of the heat dissipation paint while containing the heat dissipation material 11.

A dye determining the color of the heat dissipation paint 10 may be further included. For example, in a case where a dye, such as graphite, is further added in addition to the heat dissipation material 11 and the adhesive material 12, a heat dissipation layer formed on the semiconductor package may be in a black color.

A heat conductive material including a metal oxide such as aluminum oxide and iron oxide may be used in the heat dissipation material 11 as a first material constituting the heat dissipation paint 10, and the adhesive material 12 as a second material may be formed of a resin composition including an epoxy resin and imidazole or a resin composition including an epoxy resin and amine.

Herein, the metal oxide may be included in an amount of 80 wt % to 90 wt % and the resin composition may be included in an amount of 1 wt % to 10 wt %. In addition, a dye or a curing agent may be further added. In the case that the amount of the metal oxide added is less than the above range, a heat dissipation effect may be deteriorated, and in the case in which the amount of the metal oxide added is greater than the above range, the adhesion with the semiconductor device may be decreased. When particles of the metal oxide are connected to one another, heat dissipation routes may be formed as described in the drawing and the heat generated from the semiconductor device may be easily dissipated to the outside along the heat dissipation routes.

The electrode pattern 120 is disposed on the base film 110 at a predetermined distance, and a lower side of the semiconductor device 140 formed on the conductive pad 141 is formed of empty space due to the space between the electrode patterns 120.

The COF type semiconductor package having the above structure may be used as a driver IC of a liquid crystal panel, and the underfill 151 and the upperfill 152 may effectively dissipate high heat generated from a high resolution TV or monitor.

Hereinafter, a method of manufacturing a semiconductor package according to an embodiment of the present invention will be described. For reference, the manufacturing method will be described by focusing on a single semiconductor package with reference to FIGS. 2 to 5, and a series of processes for manufacturing a plurality of semiconductor packages by a reel-to-reel method will be described with reference to FIGS. 7 to 10.

First, a process of forming a single semiconductor package will be described with reference to FIGS. 2 to 5.

Figure 2:
FIGS. 2 to 5 illustrate a method of manufacturing a semiconductor package according to an embodiment of the present invention.

Referring to FIG. 2, an electrode pattern 120 is formed on a base film 110 which is a flexible film, and the electrode pattern 120 is formed to be spaced apart in consideration of the size of a semiconductor device 140. That is, the electrode pattern 120 is formed to be spaced apart by a predetermined distance so as to overlap with a portion of the semiconductor device 140.

Figure 3:
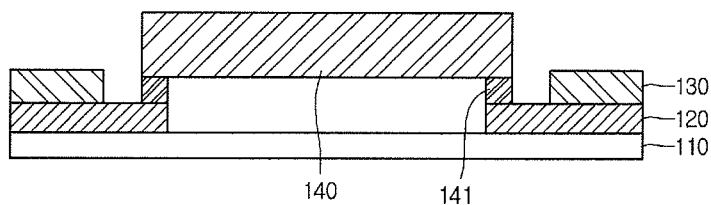

Next, referring to FIG. 3, a conductive pad 141 of a metallic material is formed on the semiconductor device 140. In order for the semiconductor device 140 to be electrically connected to the electrode pattern 120 through the conductive pad 141, the conductive pad 141 is formed to be electrically connected to the electrode pattern 120. According to an embodiment of the present invention, the conductive pad 141 is disposed between the semiconductor device 140 and the electrode pattern 120 and is in contact with the semiconductor device 140 and the electrode pattern 120. Thus, the conductive pad 141 is electrically connected to the semiconductor device 140 and the electrode pattern 120.

A second protective layer 130, which is disposed at a predetermined distance from the conductive pad 141, is formed on the electrode pattern 120. The second protective layer 130 is formed of an insulation material, and if necessary, the second protective layer 130 may not be formed on the electrode pattern 120.

Figure 4:
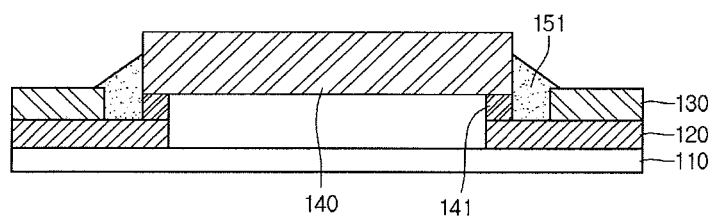

Thereafter, referring to FIG. 4, a first thin film forming process for coating or depositing a peripheral portion of the semiconductor device 140 with a heat dissipation paint 10 is performed. Herein, the heat dissipation paint 10 is formed around the entire peripheral portion of the semiconductor device 140 and the formed heat dissipation paint 10 is filled in a space between the conductive pad 141 and the second protective layer 130 to be an underfill 151. As illustrated in the drawing, the underfill 151 is also formed on an exposed top surface of the electrode pattern 120.

Figure 8:
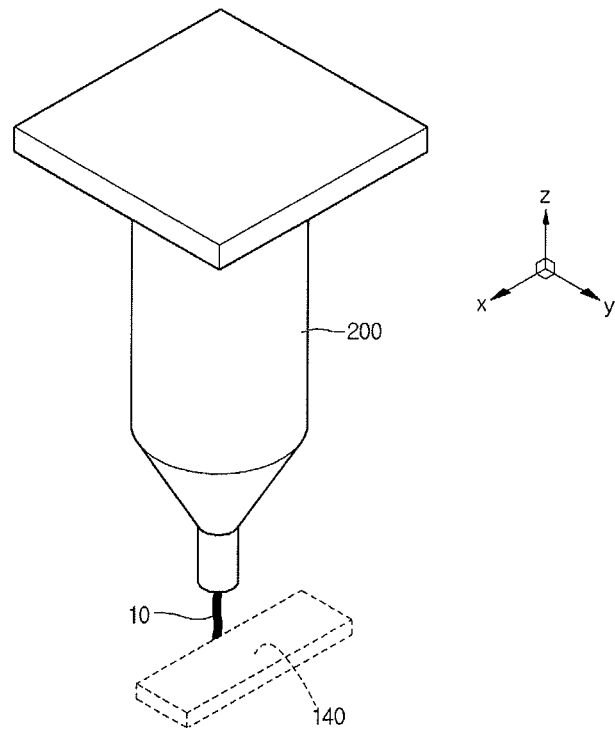
FIG. 8 illustrates an example of a potting device for coating the heat dissipation paint according to the embodiment of the present invention.

The thin film forming process for coating or depositing the heat dissipation paint 10 may be performed by a coating apparatus 200 as illustrated in FIG. 8. The coating apparatus 200 may have planar movement in x-axis and y-axis directions as well as vertical movement in a z-axis direction.

Although not shown in the drawing, an apparatus supplying the heat dissipation paint 10 to the coating apparatus 200 may be further prepared, and tanks respectively storing a heat dissipation material and an adhesive material, which constitute the heat dissipation paint 10, may be further included.

When forming the underfill 151 using the coating apparatus 200, the coating apparatus 200 moves along the peripheral portion of the semiconductor device 140, and the underfill 151 is formed by discharging the heat dissipation paint 10, which the heat dissipation material and the adhesive material are mixed therein, through a discharge port of the coating apparatus 200.

Figure 5:
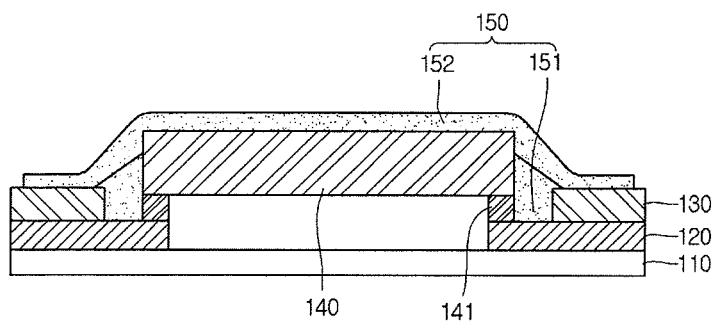

After the underfill 151 is formed, a second thin film forming process for coating or depositing the heat dissipation paint on the semiconductor device 140 and the second protective layer 130 is performed thereby extending the underfill 151. Referring to FIG. 5, the heat dissipation paint 10 is coated on the semiconductor device 140, the second protective layer 130, and the underfill 151 to form an upperfill 152, and thus, the semiconductor device 140 is sealed. The coating or depositing of the heat dissipation paint 10 for forming the upperfill 152 may also be performed by the coating apparatus 200.

After the thin film forming process for forming the underfill 151 and the thin film forming process for forming the upperfill 152 are respectively performed, processes for curing the heat dissipation paint may be performed. The curing process may be performed after each thin film forming process or may be performed only once after the formation of the upperfill 152.

The underfill 151 and the upperfill 152 may not be formed by each separate thin film forming process, but may be formed by the same thin film forming process. Also, the second protective layer 130 may not be formed, and in this case, the upperfill 152 may be formed on the semiconductor device 140, the underfill 151, and the electrode pattern 120. Other embodiments will be described later with reference to the accompanying drawings.

Thin film forming processes for respectively forming an underfill and an upperfill will be described by focusing on a semiconductor device formed on a flexible film with reference to FIGS. 7 to 10.

Figure 7:
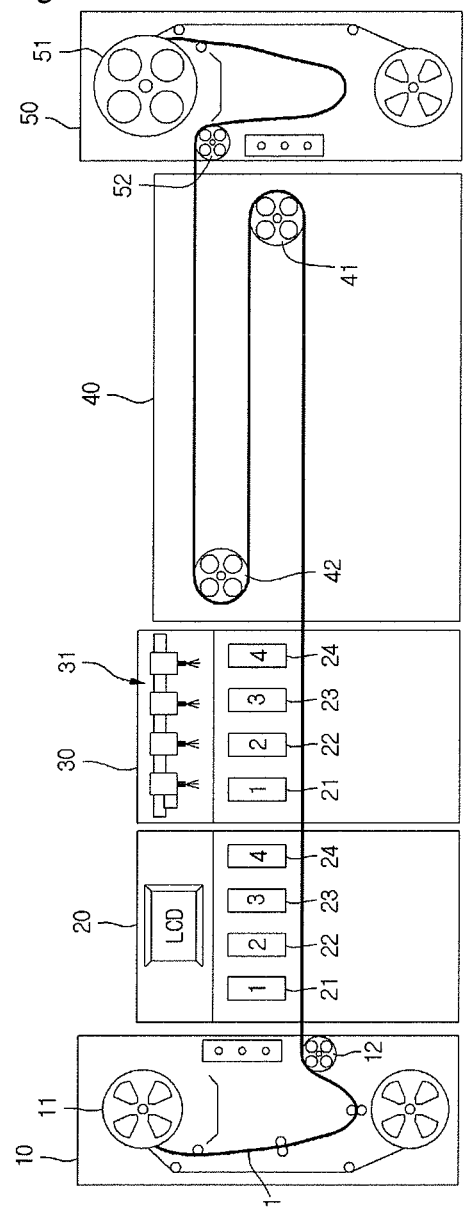
FIG. 7 illustrates a configuration of chambers for manufacturing a COF type semiconductor package according to an embodiment of the present invention.

In the present embodiment, the thin film forming process for forming the underfill and the thin film forming process for forming the upperfill are performed by a reel-to-reel method after the semiconductor device has been formed on the flexible film of a plastic material. As illustrated in FIG. 7, an underfill 151 formed in a space between a semiconductor device 140 and a second protective layer 130 and an upperfill 152 formed on the semiconductor device 140, the underfill 151, and the second protective layer 130 in the form of extending from the underfill 151 are formed, and a process for curing the underfill 151 and the upperfill 152 each formed of a thin film may then be performed. In contrast, as another embodiment, the underfill 151 is formed and a curing process is then performed. Then, the upperfill 152 may be formed after the curing process is performed.

Specifically, referring to FIG. 7, a pre-reel 11, on which a flexible film 110 having a semiconductor device 140 formed thereon is wound, is accommodated in a prechamber 10, and the flexible film 110 wound on the pre-reel 11 is transferred to an adjacent potting chamber 20 by at least one or more auxiliary reels 12. Herein, it was described that the flexible film 110 is wound on the pre-reel 11. However, it must be understood that the flexible film 110 includes the base film 110 in a flexible form, the electrode pattern 120 formed on the base film 110, the second protective layer 130 which is formed on the electrode pattern 120 and is formed of an insulation material, the conductive pad 141 electrically connected to the electrode pattern 120, and the semiconductor device 140 formed on the conductive pad 141 (see FIG. 1).

The underfill 151 is formed by thin film coating the flexible film with a heat dissipation paint, as a resin for circuit protection, while the flexible film, in the state in which the semiconductor device 140 is formed on the conductive pad 141 as illustrated in FIG. 3, passes through the potting chamber 20. Insulation of the electrode pattern 120 formed of a conductor (e.g., a conductive material such as copper or aluminum) and primary protection of the semiconductor device 140 are performed by the underfill 151.

Then, the upperfill 152 is formed by coating the semiconductor device 140, the underfill 151, and the second protection layer 130 with a heat dissipation paint while the flexible film, in the state of being coated with the heat dissipation paint as the resin for circuit protection, passes through a coating chamber 30. In the present embodiment, it is described as an example that the flexible film is coated with the heat dissipation paint. However, as another embodiment, a heat dissipation layer, such as the underfill 151 or the upperfill 152, may be formed by depositing a flexible film with a heat dissipation material similar to the heat dissipation paint.

Referring again to FIG. 7, the flexible film 110 provided from the prechamber 10 is transferred to the potting chamber 20 for coating a resin for circuit protection. In the potting chamber 20, four sides of the semiconductor device are coated with the resin for circuit protection by a potting device 21. For reference, semiconductor packages in the potting chamber 20 and the coating chamber 30 are illustrated as semiconductor packages Nos. 1 to 4 21, 22, 23, and 24. However, this is for describing a coating method, and actually, the semiconductor packages are disposed on the flexible film 110 at a predetermined distance.

In the potting chamber 20, as illustrated in FIG. 8, the potting device 200 for coating the sides of the semiconductor device with a heat dissipation paint is prepared, and the potting device 200 is made to be movable in at least biaxial directions. For example, the potting device 200 may be configured to be movable in x-axis and y-axis directions, and in this case, the four sides of the rectangular semiconductor device 140 may be coated with the heat dissipation paint. In a case where the potting device 200 is also movable in a z-axis direction in the drawing, since a distance between the semiconductor device 140 and the potting device 200 may be adjusted, an amount of the heat dissipation paint dropped on the sides of the semiconductor device 140 may also be adjusted.

Thin film formation of the heat dissipation paint is performed on the sides of the semiconductor device 140 by the at least one or more potting devices 200 in the potting chamber 20, and as a result, an underfill 151 as in FIG. 4 is formed. Design of the position of the potting device 200 is necessary in order for the underfill 151 to be filled in a space between the electrode pattern 120 and the sides of the semiconductor device 140.

The flexible film 110 is coated with the resin for circuit protection in the potting chamber 20 and is then transferred to the coating chamber 30 to perform a thin film forming process for forming an upperfill on the semiconductor device 140.

In the coating chamber 300, the heat dissipation paint is sprayed toward the semiconductor device through at least one or more spray nozzles, and the number of the spray nozzles may be variously changed according to a size of the coating chamber 30 and the number of the semiconductor devices formed on the flexible film 110.

The configuration of a coating apparatus 31 prepared in the coating chamber 30 will be described with reference to FIG. 9.

Figure 9:
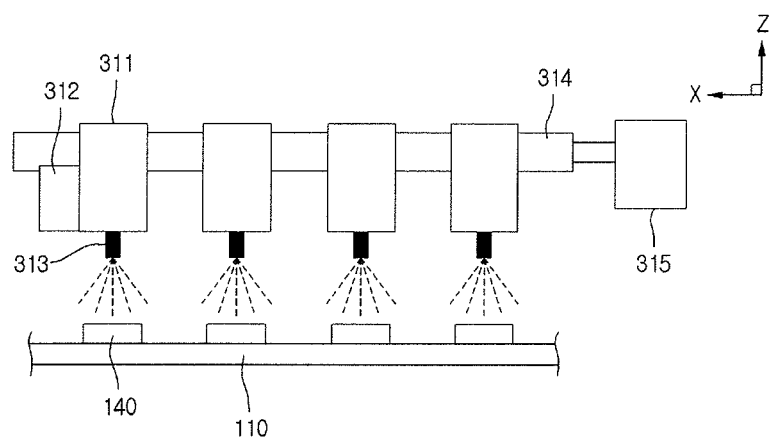
FIG. 9 illustrates a configuration of a coating apparatus prepared in a coating chamber according to an embodiment of the present invention.

Referring to FIG. 9, the coating apparatus 31 may include at least one or more spray nozzles 311 for spraying the heat dissipation paint toward the semiconductor device by a spray method, and a charge-coupled device (CCD) camera 312 for photographing the top surface of the semiconductor device may be prepared near the spray nozzle 311. An operator or computer may control the amount or speed of the heat dissipation paint sprayed through the spray nozzle 311 while checking the coating status of the heat dissipation paint that is observed through the camera 312.

A spay port 313 for determining the spay direction or spray angle of the heat dissipation paint is prepared in the spay nozzle 311.

The coating apparatus 31 may further include a driving unit 315 for rotating or moving a nozzle support frame 314 supporting the spray nozzles 311, and the driving unit 315 may allow the nozzle support frame 314 to be movable in a y-axis direction (forward and backward in the drawing) and a z-axis direction (upward and downward in the drawing). When the nozzle support frame 314 and the spray nozzle 311 move in the y-axis (or x-axis) direction according to the operation of the driving unit 315, the semiconductor device 140 and the underfill 151 may be uniformly coated with the heat dissipation paint that is sprayed through the spray port 313.

As described above, a case where the flexible film is coated with the heat dissipation paint was described as an example in the present embodiment. However, a heat dissipation layer such as the underfill may be formed by depositing the flexible film with a heat dissipation material similar to the heat dissipation paint that is proposed in the present invention.

After a thin film of the heat dissipation paint was formed on the semiconductor device 140, the underfill 151, and the second protective layer 130 by a method as described above, the flexible film 110 is transferred to a curing chamber 40 and curing of the heat dissipation paint is performed in the curing chamber 40.

A plurality of guide reels 41 and 42 is disposed in the curing chamber 40 and thus, a holding time of the flexible film 110 in the curing chamber 40 may be adjusted. The curing in the curing chamber 40 may be thermal curing, ultraviolet (UV) curing, and room temperature curing, and the curing may be performed using a UV light source and an oven for thermal curing.

The guide reels determining a transfer direction of the flexible film 110 in the curing chamber 40 are illustrated as the first guide reel 41 and the second guide reel 42. However, the arrangement and the number of the guide reels may be sufficiently changed.

The flexible film 110 cured in the curing chamber 40 is transferred to a recovery chamber 50, and the flexible film 110 is wound on a recovery reel 51 prepared in the recovery chamber 50. At least one or more auxiliary reels 52, which allows the flexible film 110 to be transferred to the recovery reel 51, may be further included in the recovery chamber 50.

The flexible film 110 wound on the recovery reel 51 by the above-described processes may have a structure as illustrated in FIG. 5.

As described above, by changing the position of the curing chamber, a curing process may be performed after the underfill 151 formed between the semiconductor device and the second protective layer 130 is formed, and a thin film forming process for forming the upperfill 152 may be performed after the curing process is performed.

Figure 10:
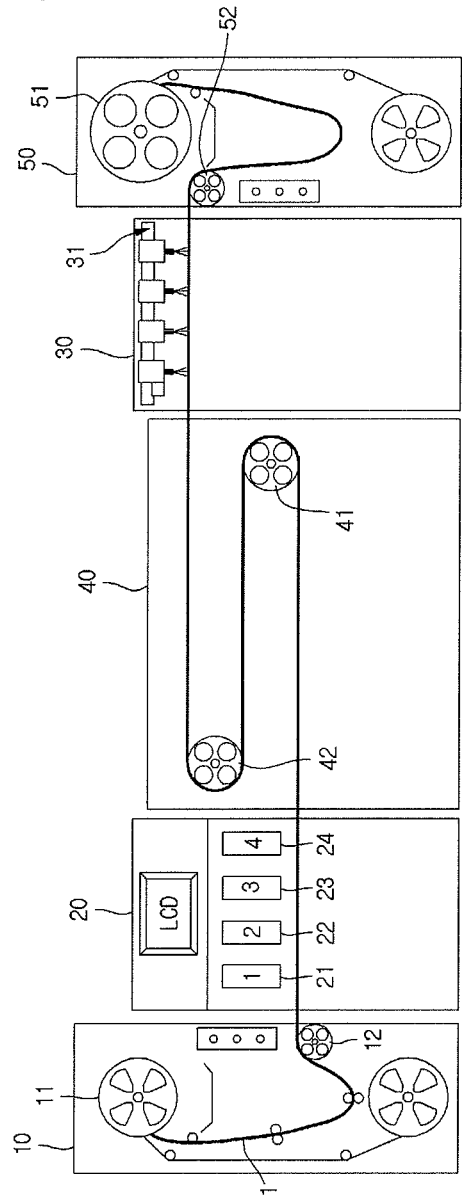
FIG. 10 is an exemplary system view, in a case where a curing process and a thin film forming process for forming an upperfill are performed after thin film formation of an underfill according to an embodiment of the present invention.

FIG. 10 is an exemplary system view, in a case where the curing process and the thin film forming process for forming the upperfill 152 are performed after thin film formation of the underfill 151 according to the present embodiment.

In FIG. 7, the embodiment was described, in which the heat dissipation paint is coated in the coating chamber after coating the resin for circuit protection in the potting chamber, and the curing process is then performed in the curing chamber. However, with respect to FIG. 10, a flexible film 110 provided from a prechamber 10 passes through a potting chamber 20 and is then transferred to a curing chamber 40. A coating chamber 30 for coating a heat dissipation paint is positioned behind the curing chamber.

Also, as another embodiment, when the coating chamber 30 is not configured, only the underfill 151 may be formed on the sides of the semiconductor device. In contrast, when the potting chamber 20 is not configured, only the upperfill 152 may be formed on the top surface of the semiconductor device. That these various embodiments are possible is because the heat dissipation paint of the present embodiment may not only protect a circuit, but may also dissipate the heat generated from the semiconductor device.

Configurations of a semiconductor package, which may be variously formed according to the present embodiment, will be described with reference to the drawings.

Figure 11:
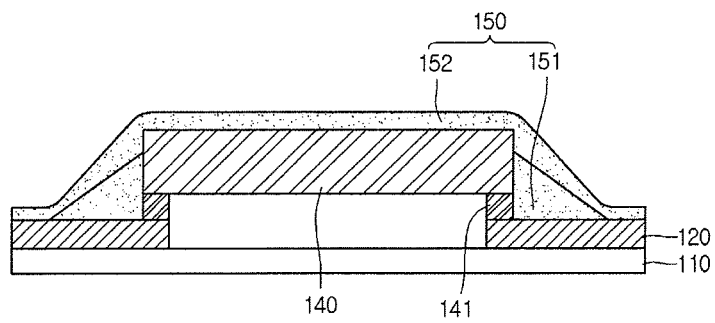
FIG. 11 illustrates a configuration of a semiconductor package according to another embodiment of the present invention.

FIG. 11 illustrates a configuration of a semiconductor package according to another embodiment of the present invention.

Referring to FIG. 11, an electrode pattern 120 formed on a base film 110 which is a flexible film, a conductive pad 141 formed on the electrode pattern 120, a semiconductor device 140 electrically connected to the electrode pattern 120 through the conductive pad 141, and a protective layer 150 which seals the conductive pad 141 and the semiconductor device 140 and is formed on the electrode pattern 120 are included.

In particular, the protective layer 150 includes an underfill 151 for sealing the semiconductor device 140, the conductive pad 141, and the electrode pattern 120 while being formed directly on the electrode pattern 120, and an upperfill 152 for sealing the semiconductor device 140, the underfill 151, and the electrode pattern 120.

That is, the underfill 151 is formed on a portion of a top surface of the electrode pattern 120 and sides of the semiconductor device 140 and the conductive pad 141, and the upperfill 152 is formed on the semiconductor device 140, the underfill 151, and the electrode pattern 120. In a case where the underfill 151 is not formed on the entire sides of the semiconductor device 140, the upperfill 152 is also formed on the sides of the semiconductor device 140.

As described above, in a case where a second protective layer 130 is not formed, the underfill 151 and the upperfill 152 are not separately formed, but the underfill 151 and the upperfill 152 may be formed in one piece at the same time. Such an embodiment is illustrated in FIG. 12.

Figure 12:
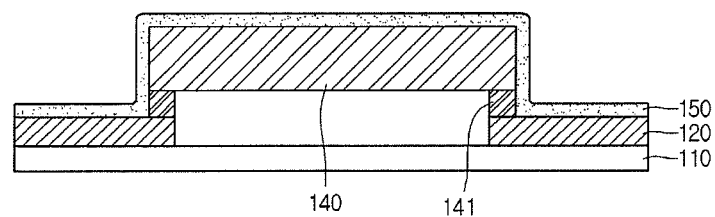
FIG. 12 illustrates a configuration of a semiconductor package according to still another embodiment of the present invention.

FIG. 12 illustrates a configuration of a semiconductor package according to still another embodiment of the present invention.

Referring to FIG. 12, a case is illustrated, in which a semiconductor device 140 and a conductive pad 141 are formed on an electrode pattern 120, and a single protective layer 150 is then formed by performing a thin film forming process of coating or depositing an entire exposed surface of the semiconductor device 140 and the electrode pattern 120 with a heat dissipation paint.

The protective layer 150 in the above embodiment is formed on a top surface and sides of the semiconductor device 140, sides of the conductive pad 141, and a top surface of the electrode pattern 120. Even in this case, the protective layer 150 may not only dissipate heat generated from the semiconductor device 140, but may also seal the semiconductor device 140, the conductive pad 141, and the electrode pattern 120.

Figure 13:
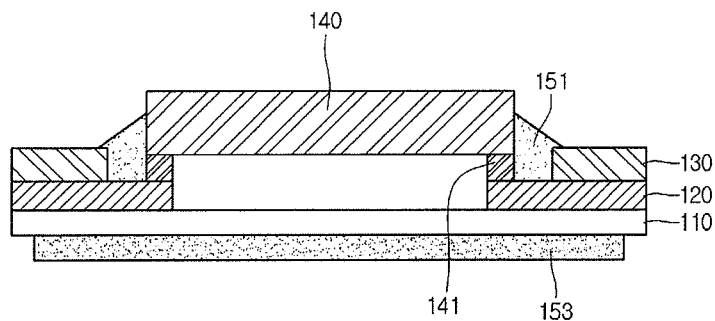
FIG. 13 illustrates a configuration of a semiconductor package according to still another embodiment of the present invention.

FIG. 13 illustrates a configuration of a semiconductor package according to still another embodiment of the present invention.

Referring to FIG. 13, a COF type semiconductor package according to the still another embodiment of the present invention includes an electrode pattern 120 on a first surface of a base film 110 of a flexible material, a semiconductor device 140 mounted on a conductive pad 141 that is disposed on the electrode pattern 120, a second protective layer 130 formed on the electrode pattern 120, and an underfill 151 filled in a space between the semiconductor device 140 and the electrode pattern 120.

In particular, a second surface of the base film 110 is coated or thin film coated with a rear heat dissipation layer 153 for dissipating heat generated from the semiconductor device 140.

The heat generated from the semiconductor device 140 may be dissipated upward by the underfill 151 or may be transferred to the electrode pattern 120 and the base film 110 through the conductive pad 141, and the heat may be easily dissipated to the outside through the rear heat dissipation layer 153. A material constituting the rear heat dissipation layer 153 may consist of a heat dissipation paint as described above, and configurations of a reel and a chamber for reversing upper and lower surfaces of the base film 110 may be added in a process of forming the rear heat dissipation layer 153 in the system of FIG. 7 or 10.

The COF type semiconductor packages according to the above-described embodiments of the present invention may effectively dissipate high heat generated from a semiconductor device to the outside and may change a material of a bezel or chassis forming an exterior except a liquid crystal panel in an ultra high resolution TV or monitor. For example, with respect to an ultra high resolution TV, bezel and chassis parts may be reduced to achieve a slimmer design, wherein a material, such as aluminum, has been used for withstanding high heat generated from ICs. However, when the heat generation of the ICs may be effectively reduced according to the present embodiment, the bezel and chassis parts of the TV may be formed of a plastic material, and thus, weight reduction of the product may be possible, the width of the device may be reduced, and the reduction of production costs may also be achieved.

INDUSTRIAL APPLICABILITY

Since the present invention is suitable for manufacturing a COF type semiconductor package, the present invention has industrial applicability.

The invention claimed is:

1. A chip on film (COF) type semiconductor package, comprising:
   a flexible film;
   an electrode pattern formed on the flexible film;
   a semiconductor device disposed on the electrode pattern;
   a conductive pad disposed between the electrode pattern and the semiconductor device to electrically connect the semiconductor device with the electrode pattern; and
   a first protective layer that covers an entire outside surface of the flexible film to seal the conductive pad and the semiconductor device and is formed directly on a portion of the electrode pattern and the semiconductor device,
   wherein the first protective layer includes: a heat conductive material for dissipating heat generated from the semiconductor device; and an adhesive material.

2. The COF type semiconductor package of claim 1, further comprising a second protective layer formed on the electrode pattern to be spaced apart from the conductive pad,
   wherein the first protective layer seals a space between the semiconductor device, the conductive pad, and the second protective layer.

3. The COF type semiconductor package of claim 2, wherein the first protective layer comprises:
   an underfill formed in a space between the second protective layer and the conductive pad; and
   an upperfill formed on the semiconductor device, the underfill, and a portion of the second protective layer.

4. The COF type semiconductor package of claim 1, wherein the heat conductive material comprises aluminum oxide or iron oxide, and
   the adhesive material comprises a resin composition including an epoxy resin and imidazole or a resin composition including an epoxy resin and amine.

5. The COF type semiconductor package of claim 1, wherein the first protective layer comprises the heat conductive material in an amount of 80 wt % to 90 wt % and the adhesive material in an amount of 1 wt % to 10 wt %.

6. The COF type semiconductor package of claim 1, wherein the conductive pad is formed in one piece with the semiconductor device under the semiconductor device.

7. The COF type semiconductor package of claim 1, wherein the first protective layer is formed by coating or depositing a heat dissipation paint comprising the heat conductive material.

8. The COF type semiconductor package of claim 1, wherein the first protective layer is continuously formed along a top surface and sides of the semiconductor device, sides of the conductive pad, and a top surface of the portion of the electrode pattern.

9. A chip on film (COF) type semiconductor package comprising:
   a base film formed of a flexible material;
   an electrode pattern formed on a first surface of the base film;
   a semiconductor device mounted on the electrode pattern;
   a protective layer formed on the electrode pattern and formed of an insulation material;
   an underfill filled in a space between the semiconductor device and the protective layer; and
   a heat dissipation layer formed on a second surface of the base film to dissipate heat generated from the semiconductor device,
   wherein the heat dissipation layer comprises a heat conductive material and an adhesive material.

\* \* \* \* \*